April 11, 1967 A. GLANC 3,313,950

REACTANCE PARAMETRIC AMPLIFIER

Filed Aug. 25, 1964

INVENTOR.
ANTONIN GLANC
BY
Attorney 3,313,950
Patented Apr. 11, 1967

3,313,950

REACTANCE PARAMETRIC AMPLIFIER

Antonín Glanc, Libochovice, Czechoslovakia, assignor to Ceskoslovenska akademie ved, Prague, Czechoslovakia, a corporation of Czechoslovakia Filed Aug. 25, 1964, Ser. No. 391,951
Claims priority, application Czechoslovakia, Aug. 31, 1963, PV 4,852/63
4 Claims. (Cl. 307—88.3)

The invention relates to electric circuits for amplifying signals, using the parametric principle.

Such amplifiers comprise usually a semiconductor diode acting as non-linear voltage dependent capacitor which forms the coupling between a circuit tuned to the signal frequency, between the circuit of the local oscillator, the so called pumping oscillator, and between the output circuit. But the semiconductor diode is attended in this connection with several drawbacks which limit its useful range of application. Its capacity depends on voltage only to a relatively small extent so that the amplification of the reactance amplifier, or the conversion gain ratio is small. Moreover the operation of the diode depends on the series resistance of the diode and this effects the operation of the diode on the highest frequencies and it limits the frequency range over which these circuits may be employed.

It is a general object of this invention to remove these drawbacks and to provide an amplifier with satisfactory gain even at the highest frequencies.

Briefly stated, the more specific feature of the invention resides in the fact that in these circuits which are known per se, the non-linear semiconductor capacitor is replaced by a non-linear coupling capacitor with a ferroelectric dielectric which possesses a temperature region in which its imaginary component of the complex permittivity drops with increasing temperature. The source of the pumping frequency is provided with regulation means which allow adjustment of the power drawn therefrom, in such a manner that the dielectric of the said capacitor is heated by the dielectric losses into the region of the dropping imaginary component of the complex permittivity. Due to the fact that this temperature lies in the close vicinity of the Curie point, as disclosed in more detail in my Patent Application Serial No. 318,302, and that the state of the dielectric becomes automatically stabilized by internal dielectric losses at this temperature, without any external heating means, one achieves on the one hand that the dielectric works in a temperature region in which its non-linear properties become more emphasized, and on the other hand that its dielectric hysteresis does not come into action. Otherwise, this dielectric hysteresis is the cause why the dielectric may be used only over a limited frequency range. A suitable dielectric for such circuits is for example ferroelectric triglycine sulphate (TGS).

It can be seen from the above that amplification in accordance with the invention takes place in a non-linear element the temperature of which becomes automatically stabilized in the region of its maximum non-linearities. Theoretically, this non-linear member can change its reactance quickly without limitation which makes possible amplification or mixing up to the highest frequencies because the temperature region in which the non-linear dielectric element works does not admit existence of domain processes and movement of domain walls. Because of this, and also due to the fact that the non-linear dielectric element functions in this case almost as a pure capacity, it does not add to noise. This is an appreciable advantage in comparison with known mixer circuits with semiconductor diodes where the mixing semiconductor element itself is the source of thermal noise in consequence of electron processes in the semiconductor. Non-linear ferroelectric capacitors can be produced without technological difficulties in such a manner that their average capacity in the temperature autostabilizing mode of operation or regime is for example 1 pF or even 1000 pF. It can be seen from the above said that the parametric circuits in accordance with the invention may be used in the design of noiseless amplifiers operating at the highest frequencies, or at low frequencies.

The invention will be best understood from the following specification to be read in conjunction with the accompanying drawing, in which.

Figure 1:
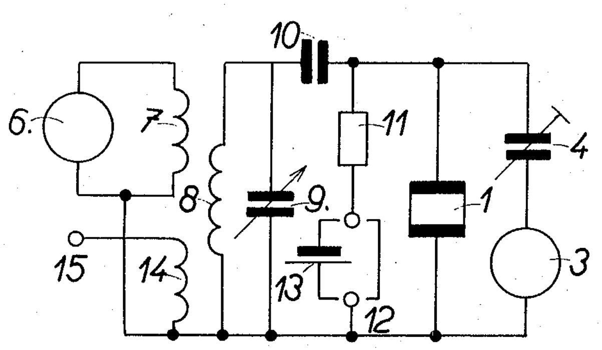
FIG. 1 represents the circuit arrangement of a reactance amplifier in accordance with the invention.

Referring now more particularly to FIG. 1 showing a reactance amplifier. It should be understood that 1 is a simple non-linear dielectric element made of a dielectric possessing a region in which the complex permittivity drops with temperature, 3 is the source of pumping voltage and and dielectric heating with a frequency $f_p$, 4 is a variable heating capacitor, 6 is a signal source of frequency $f_s$, 7 is the input winding, 8 is an inductance coupled with 7 and forming with the capacitor 9 a resonant circuit, 10 is a coupling capacitor, 11 is a leakage resistor to lead away the charge (if the link 12 is in place), or for supplying direct current polarization from voltage source 13. The output winding 14 is inductively coupled with the inductace 8 of the resonant circuit and it is connected with the output terminal 15.

The function of this circuit is based on the fact that the reactance of the dielectric element 1 is periodically changed by the alternating electric voltage supplied into the circuit from the source of the pumping frequency 3. This gives rise to combination frequencies $f_{11}=f_p+f_s$ and $f_{12}=f_p-f_s$.

Let it first be assumed that the pumping frequency is the exact double of the signal frequency so that the second combination frequency $f_{12}=f_p-f_s$ is the same as the signal frequency. Since the input circuit 8, 9 is tuned to this frequency, the amplified signal $$f_{12}=f_p-f_s=2f_s-f_s=f_s$$

may be derived for example by means of the coupling winding 14 from the input circuit.

If the pumping frequency is not an exact double of the signal frequency, the value of the produced difference combination frequency differs to a certain degree from the signal frequency, and in the circuit 8, 9 there exist two different signals of approximately equal strength, but with somewhat different frequencies. Under practical conditions, this fact may cause much interference in a frequency band occupied by several stations. In addition to this disadvantage of the single-circuit amplifier there is another disadvantage, namely the necessity of maintaining the phase ratios $f_s$ and $f_p$. In practice this means that the frequency of the pumping source 3 must be very stable and the source must therefore be controlled by a crystal, or frequency synthesis must be used.

It has been found experimentally that the pumping frequency $f_p$ need not be an exact double of the signal frequency $f_s$. On the contrary, for optimal amplification the pumping frequency differs from the double frequency of the signal; as a rule it is higher. Consequently there are produced on both sides of the pumping frequency two more combination frequencies $f_{11}=f_p+f_s$ and $f_{12}=f_p-f_s$ none of which coincides with the input signal $f_s$. This arrangement shifts the combination components to higher frequencies, and the signal can therefore no longer appear in the input circuit.

To allow correct operation of this amplifier, it is necessary to arrange a further auxiliary circuit for the additive combination frequency $f_p+f_s$ which has now been shifted much higher than $f_p$, the said auxiliary circuit being tuned to this frequency.

Figure 2:
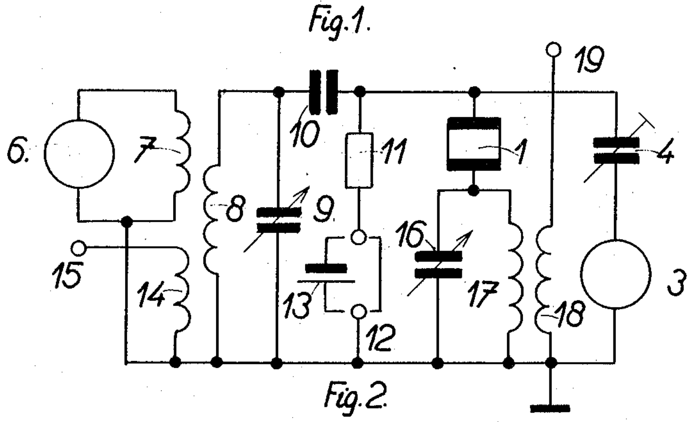
FIG. 2 illustrates a reactance amplifier with an auxiliary circuit tuned to some combination frequency.

This circuit arrangement is shown in FIG. 2 where 16 denotes the capacity and 17 the inductance of this auxiliary resonant circuit. The winding 18 is coupled with the inductance 17 and it is connected in a further output 19, as will be explained in more detail below.

In this manner one obtains an amplifier with two circuits operating at three frequencies $f_s$, $f_p$ and $f_1$, the latter frequency being equal to the sum $f_p+f_s$. Also in this case the amplified signal is derived from the input circuit 8, 9. This circuit arrangement has the great advantage that the source of pumping voltage need not be stabilized.

If the output 19 of the circuit 16, 17 is used, and if this circuit is tuned to maximum gain, one obtains a mixer which acts as amplifier.

In the output 19 appears an amplified signal with another frequency $f_p+f_s$ or $f_p-f_s$. If the pumping frequency is selected to be much higher than the frequency of the signal, the device is usually called an upconverter.

In the previously mentioned type of amplifiers and mixers in accordance with the invention, the pumping source performs a double function, namely: in the first place it produces changes in the capacity of the non-linear coupling capacitor which causes amplification and mixing. But it also produces dielectric heating of the dielectric material of the non-linear coupling capacitor into the region in which the imaginary component of the complex permittivity drops and where the conditions of autostabilizing operation with a self-stabilized temperature and with a maximum of non-linear properties of the dielectric are produced.

In all mentioned circuit arrangement the variable or regulation capacitor 4 is used for adjusting the necessary degree of heating.

But adjustment of this capacitor also decides the value or magnitude of the pumping voltage in the circuit. However, this value which is required for obtaining the necessary dielectric heating energy need not be the most advantageous also for mixing.

Another object of the invention is therefore a reactance amplifier or mixer in which each of the two functions of the pumping voltage is employed separately. Such a circuit-arrangement is made possible by the multiple nonlinear dielectric element with indirect heating according to my Patent application Serial No. 348,689.

Figure 3:
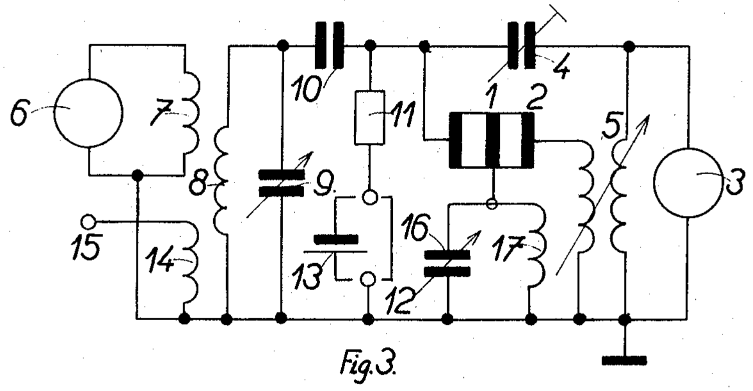
FIG. 3 is the circuit arrangement of an amplifier similar to that in FIG. 2 but with an indirectly heated non-linear coupling capacitor and with modified inductive coupling between the heating body and the source of a pumping voltage.

An example of employing an indirectly heated element in the circuit of an amplifier is shown in FIG. 3 in which the heating element 2 serves for indirect dielectric heating of the signal body 1, and 5 is a variable regulation high-frequency transformer for controlling the heating power.

First, by changing the coupling of the transformer 5, one adjusts this dielectric heating of the dielectric material of the additional capacitor 2. Due to the fact that the capacitors 2 and 1 are in good thermal contact via a common electrode, capacitor 1 reaches the same temperature as capacitor 2, this temperature being stabilized just in the region of maximum non-linearities. The amplitude of the pumping voltage can be controlled on capacitor 1 by means of capacitor 4. The other elements in the circuit have the same function as in the preceding cases. This is a case of structural combination of two non-linear capacitors with a ferroelectric dielectric, one of these dielectrics being heated by a high-frequency voltage to the point of temperature autostabilization and thus it brings also the second non-linear element into the region of maximum non-linearities because this second element is in thermal contact with the first one. This non-linear element may also be supplied with very small pumping voltages and it is thus possible to adjust the most convenient ratio between the signal voltage and the pumping voltage.

The material for the heating element 2 and the heated element 1 may be provided in this case for example by ferroelectric triglycine sulphate.

It should of course be understood by those expert in the art that a high-frequency regulation transformer may also be used in all mentioned examples instead of the regulation capacitor, and vice versa.

The described circuit arrangement may be further modified and combined within the scope of this invention.

What I claim is:

1. A reactance amplifier comprising in combination a source of a signal frequency; a source of a pumping frequency; a circuit tuned to the signal frequency; input means to supply the signal frequency into said tuned circuit; a non-linear capacitor, said capacitor comprising a ferroelectric dielectric material having a temperature region above its Curie point in which a maximum of nonlinear dielectric properties are provided and at which temperature region the dielectric material can be automatically maintained by internal dielectric losses; said source of pumping frequency being connected across said non-linear capacitor for periodically varying the reactance of said capacitor and for dielectrically heating said capacitor to said temperature region with an alternating current; coupling means connecting said tuned circuit across said source of pumping frequency and said non-linear capacitor; regulation means disposed between said source of pumping frequency and said nonlinear capacitor for adjusting the dielectric heating region of said nonlinear capacitor and also for adjusting the output magnitude of said source of pumping frequency and output means for deriving amplified signals from said tuned circuit.

2. A reactance amplifier as defined in claim 1 wherein the ferroelectric dielectric material comprises triglycine sulphate.

3. A reactance amplifier as in claim 1 comprising an additional tuned circuit connected to said non-linear capacitor, said tuned circuit being tuned to a combination frequency of the signal frequency and the pumping frequency; and an additional output means coupled to said additional tuned circuit for extracting the combination frequency.

4. A reactance amplifier comprising a source of a signal frequency; a source of a pumping frequency; a circuit tuned to the said signal frequency; input means to supply the said signal frequency into the said tuned circuit; a first non-linear capacitor, said capacitor comprising a ferroelectric dielectric material which possesses a temperature region above its Curie point in which a maximum of non-linear dielectric properties are provided; a second non-linear capacitor comprising ferroelectric dielectric material capable of being maintained by dielectric losses at an autostabilized region at temperatures above its Curie point; a portion of both said first and second non-linear capacitors being adjacently disposed to allow an efficient heat transfer from said second capacitor to said first capacitor; means to derive heating current for said second non-linear capacitor from said source of pumping frequency including transformer means for adjusting said heating current to a desired value; coupling means connecting said tuned circuit across said source of pumping frequency and said non-linear capacitors; adjustment means for varying the amplitude of said pumping frequency disposed between said source of pumping frequency and said coupling means; and output means for deriving amplified signals from said tuned circuit.

References Cited by the Examiner

UNITED STATES PATENTS 2,648,823 8/1953 Kock et al. --------- 317—247

OTHER REFERENCES

Garwin: IBM Technical Disclosure Bulletin, vol. 3, No. 2, July 1960, p. 70.

Fatuzzo et al.: Proc. IRE, April 1962, p. 462.

ROY LAKE, *Primary Examiner.*

D. R. HOSTETTER, *Assistant Examiner.*